(12) United States Patent
Jung

(10) Patent No.: US 7,094,519 B2
(45) Date of Patent: Aug. 22, 2006

(54) METHOD OF MANUFACTURING A CMOS IMAGE SENSOR

(75) Inventor: Meng An Jung, Kunsan-Si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 114 days.

(21) Appl. No.: 10/746,703

(22) Filed: Dec. 24, 2003

(65) Prior Publication Data

US 2004/0142568 A1    Jul. 22, 2004

(30) Foreign Application Priority Data

Dec. 30, 2002    (KR) .................... 10-2002-0087351

(51) Int. Cl.
*H01L 31/0232* (2006.01)

(52) U.S. Cl. ..................... 430/321; 430/330

(58) Field of Classification Search ............. None
See application file for complete search history.

(56) References Cited

U.S. PATENT DOCUMENTS

| | | |
|---|---|---|
| 5,316,640 A | 5/1994 | Wakabayashi et al. |
| 5,841,126 A | 11/1998 | Fossum et al. |
| 5,853,960 A | 12/1998 | Tran et al. |
| 5,886,659 A | 3/1999 | Pain et al. |
| 5,976,907 A | 11/1999 | Shigeta et al. |
| 5,990,506 A | 11/1999 | Fossum et al. |
| 6,005,619 A | 12/1999 | Fossum |
| 6,021,172 A | 2/2000 | Fossum et al. |
| 6,861,207 B1* | 3/2005 | Hsu et al. .................... 430/321 |

FOREIGN PATENT DOCUMENTS

| | | |
|---|---|---|
| JP | 8-335686 | 12/1988 |
| JP | 6-349728 | 12/1994 |
| JP | 2002-178156 | 8/2002 |

OTHER PUBLICATIONS

Shunjl Horiuchi; Method for Manufacturing Solid-State Image Pickup Element; Patent Abstracts of Japan, Publication No. 2002-176156; Jun. 21, 2002; Japan Patent Office, Japan.
Ho Hak Chol, Jin Sub Shim, and Kwang Bok Song; Color Solid-State Image-Pickup Element and Manufacture Thereof; Patent Abstracts of Japan, Publication No. 08-335688, Dec. 17, 1996; Japan Patent Office, Japan.
Shinji Michihashi; Formation of Resist Pattern; Patent Abstracts of Japan, Publication No., 06-349728; Dec. 22, 1994; Japan Patent Office, Japan.

* cited by examiner

*Primary Examiner*—John A. McPherson
(74) *Attorney, Agent, or Firm*—Andrew D. Fortney

(57) ABSTRACT

A method of manufacturing a CMOS image sensor. The present invention enables forming micro-lenses having a uniform shape throughout a semiconductor substrate. The method of manufacturing a CMOS image sensor includes: coating a color filter layer and a semiconductor substrate with a first photoresist; selectively exposing the first photoresist to light to define a planarization layer; coating the first photoresist with a second photoresist; selectively exposing the second photoresist to define a plurality of micro-lens bodies; and baking the plurality of micro-lens bodies to form a plurality of micro-lenses.

18 Claims, 5 Drawing Sheets light

METHOD OF MANUFACTURING A CMOS IMAGE SENSOR

CROSS-REFERENCE TO RELATED APPLICATION

The entire disclosure of Korean Patent Application No. 10-2002-0087351 filed on Dec. 30, 2002 including specification, claims, drawings and summary, is incorporated herein by reference in its entirety.

BACKGROUND OF THE INVENTION

1. Field of the Invention

The present invention relates to a method of manufacturing a CMOS image sensor, and more particularly to a method of manufacturing a CMOS image sensor making it possible to form micro-lenses having a uniform shape throughout a semiconductor substrate.

2. Description of the Related Art

As generally known in the art, an "image sensor" is a semiconductor device, such as a CCD (Charge Coupled Device), a CMOS image sensor, etc., which converts optical image signals into electrical signals. The CCD has respective MOS capacitors positioned very close to each other for storing and delivering electrical charge carriers. The CMOS image sensor has adapted a switching mode by making MOS transistors as many as pixels with a CMOS technology, which uses control circuits and signal-processing circuits as peripheral circuits, and by detecting outputs in turn with the MOS transistors. In making such an image sensor, in the mean time, efforts are being made to improve the photosensitivity of the image sensor.

In general, the CMOS image sensor is composed of a photo-sensing means for sensing light and a CMOS logic circuit for processing sensed light into electrical signals to make them as data. For better photosensitivity, a Fill Factor, which is a ratio between the area of the photo-sensing means and the whole area of the image sensor, should be increased.

In the case of the CMOS image sensor, however, any attempt to increase the area of the photo-sensing means, under the restricted whole area of the sensor, has its limit because of a basic reason that the CMOS logic circuit cannot be eliminated.

As an alternative to overcome such problems, a photo-gathering technology has been widely studied that changes the path of light incident on an area other than that over the photo-sensing means and gathers the light into the photo-sensing means for better photosensitivity. An example of the photo-gathering technology is to make convex micro-lenses on top of the photo-sensing means using a material with good photo-transmittance and refract the path of incident light so that more light is transmitted to the photo-sensing means.

The structure of a CMOS image sensor using micro-lenses according to the related art will now be explained with reference to FIG. 1. The CMOS image sensor includes: a photo-sensing sensor 1 composed of photo-gates or photo-diodes, etc., to sense light and output electrical signals; a photo-shielding layer 2 made of a metallic layer to prevent any incidence of light on an area other than the photo-sensing area of the photo-sensing sensor 1; an inter-layer insulating film 3 formed on the photo-shielding layer 2; a color filter layer 4 made of dyed photoresist to transmit and deliver light with a specific wavelength to the photo-sensing sensor 1; a planarization layer 5 formed on the color filter layer 4 to overcome faults, steps or surface irregularities in the color filter layer 4; and micro-lenses 6 of polymer-based resin formed on the planarization layer 5 to gather light.

In the case of the CMOS image sensor using micro-lenses as configured above, any light parallel to the optical axes of the micro-lenses is refracted by them and focused at a location on the optical axes. Since one image sensor has tens of thousands of micro-lenses, a clear image is obtained only when the characteristics of respective micro-lenses have the same effect. Accordingly, the performance of the micro-lenses play a crucial role in the quality of image sensors.

Processes for manufacturing micro-lenses in the case of the CMOS image sensor of FIG. 1 will now be described with reference to FIGS. 2A to 2F.

First, as shown in FIG. 2A, a color filter layer 12 is formed on a substrate 11 provided with photo-sensing elements (not shown), such as photo-diodes, of an image sensor. Then, a photoresist 13 for forming the planarization layer is formed on the color filter layer 12. The photoresist for forming the planarization layer has the characteristics of low-sensitivity and high-transmittance in relation to a light source used in an exposure process during photolithography. Specifically, a negative-type photoresist is used.

Next, a reticle 15 is used to expose a predetermined area of the photoresist 13 to light for forming the planarization layer, as shown in FIG. 2B. The area exposed to light corresponds to the area where micro-lenses arc to be formed in subsequent process steps (a cell area) and the area not exposed to light corresponds to the area where pads arc to be formed in subsequent process steps (a peri, or peripheral, area). The photoresist in the area not exposed to light is then developed and removed to complete the planarization layer 14.

Thereafter, a photoresist layer 16 for forming micro-lenses is applied on the whole surface of the substrate, including the planarization layer 14, as shown in FIGS. 2D and 2E. A reticle 18 is then used to expose the photoresist 16 for forming micro-lenses to light selectively. A positive-type photoresist is used as the photoresist for forming micro-lenses. The area not exposed to light corresponds to the area where micro-lenses are to be formed.

In this state, the areas of the photoresist 16 exposed to light are developed and removed, as shown in FIG. 2F. Next, although not shown in the drawings, a baking process may be performed at a temperature of about 150° C. In this process, cuboid-shaped bodies of photoresist 17 melt to form convex micro-lenses that maintain their convex shape upon subsequent cooling.

According to the related method of manufacturing a CMOS image sensor, the planarization layer to be formed on the color filter layer cannot be formed on the peri area but on the cell area only. This causes a topographical fault, or step, between the peri area and the cell area. As a result, the photoresist for forming micro-lenses on the planarization layer generally does not have a uniform thickness over the entire surface of the substrate. A fault (believed to be caused by poor step coverage of the photoresist) then occurs at the interface between the peri area and the cell area.

Consequently, the final micro-lenses do not necessarily all have the same shape. In other words, uniform characteristics of all the micro-lenses cannot be guaranteed. The area where such irregularly shaped micro-lenses are formed is the interface between the cell area and the peri area, as mentioned above.

SUMMARY OF THE INVENTION

Accordingly, the present invention has been made to solve the above-mentioned problems occurring in the related art, and an object of the present invention is to provide a method of manufacturing a CMOS image sensor making it possible to form micro-lenses having a more uniform shape over an entire substrate.

In order to accomplish at least the above object, in whole or in parts, there is provided a method of manufacturing a CMOS image sensor including: coating a color filter layer on or over a semiconductor substrate with a first photoresist; selectively exposing predetermined areas of the first photoresist to define a planarization layer; coating the first photoresist with a second photoresist; selectively exposing the second photoresist to define a plurality of micro-lens bodies; and heating the plurality of micro-lens bodies to form a corresponding plurality of micro-lenses.

Preferably, the method further comprises removing predetermined parts of the second photoresist after the second selective exposure process, and more preferably, removing predetermined parts of the first photoresist after removing predetermined parts of the second photoresist. The method may also further comprise forming the color filter layer on or over the semiconductor substrate before coating with the first photoresist.

Preferably, the photoresist for forming the planarization layer may have a thickness of 1.3~3 µm.

Preferably, the photoresist for forming micro-lens bodies may have a thickness of 1.1~1.3 µm.

Preferably, the photoresist for forming the planarization layer may be a negative-type photoresist.

Preferably, the photoresist for forming micro-lens bodies may be a positive-type photoresist.

According to the characteristic features of the present invention, when forming the planarization layer and micro-lenses on the color filter layer successively, the photoresist for forming micro-lens bodies is patterned (e.g., developed) when the photoresist for forming the planarization layer exists in both a peri area and a cell area. The photoresist for forming the planarization layer is then patterned (e.g., developed). This avoids any irregular steps or faulting at the interface between the peri area and the cell area. As a result, micro-lenses of a generally uniform shape are obtained in subsequent process steps.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, the preferred embodiments of the present invention will be described with reference to the accompanying drawings, in order to explain the present invention in detail so that those skilled in the art can carry out the present invention easily. FIGS. 3A to 3F illustrate processes of manufacturing a CMOS image sensor according to the present invention.

For reference, the embodiments disclosed herein include preferred embodiments chosen from among various possible embodiments, and they are provided for aiding the understanding of those skilled in the art. They are not intended to limit nor restrict the technical ideas of the present invention. Accordingly, various modifications, additions and substitutions are possible, without departing from the scope and spirit of the invention and other equivalent embodiments are also possible.

Figure 1:
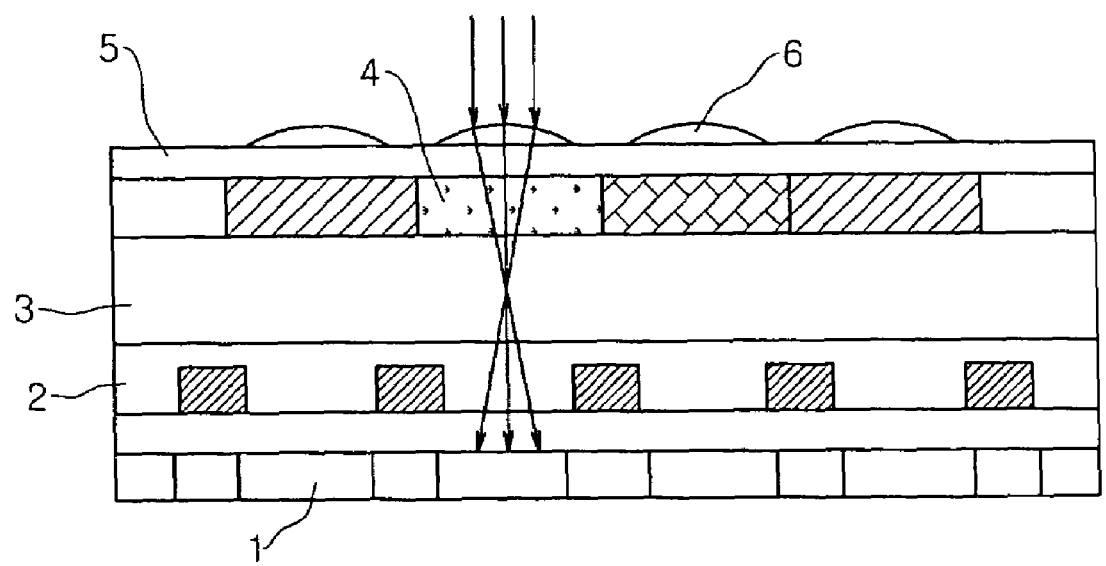
FIG. 1 illustrates the structure of a CMOS image sensor according to the related art.
Figure 2A:
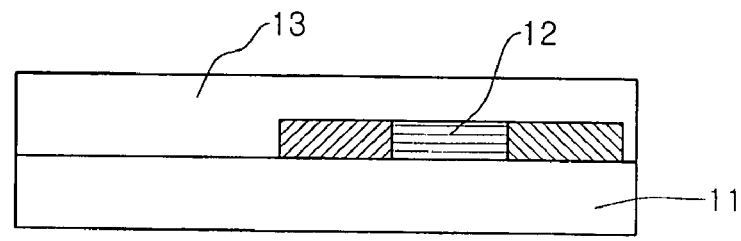
FIGS. 2A to 2F illustrate process steps of a method of manufacturing a CMOS image sensor according to the related art.
Figure 2B:
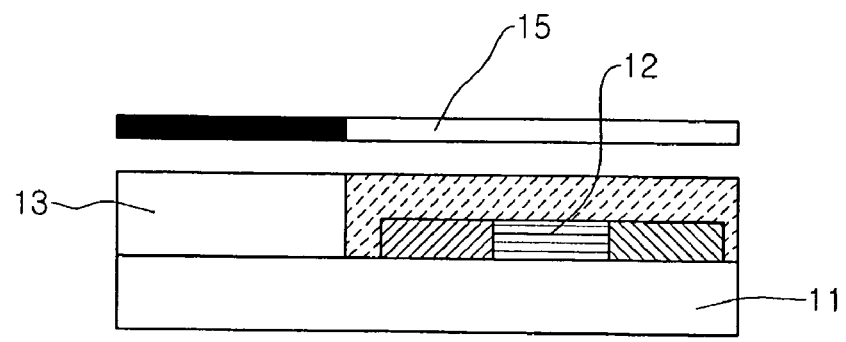
Figure 2C:
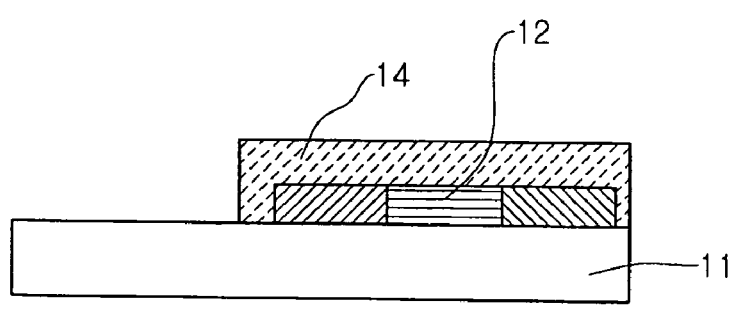
Figure 2D:
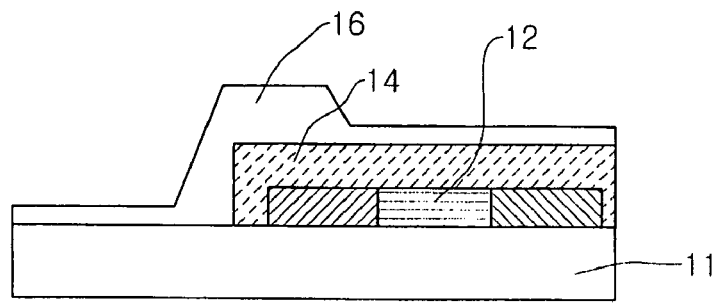
Figure 2E:
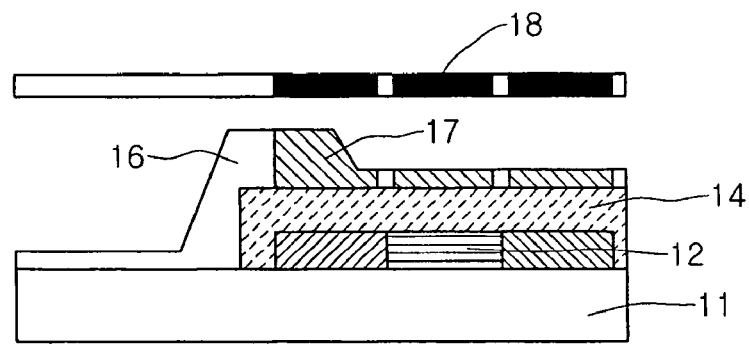
Figure 2F:
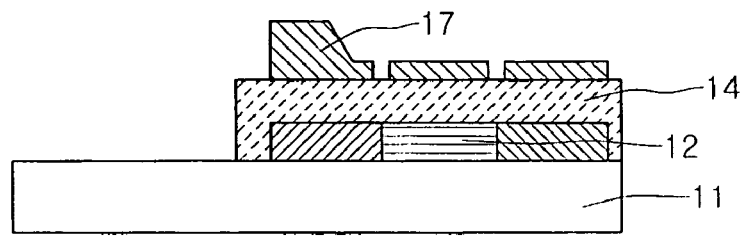
Figure 3A:
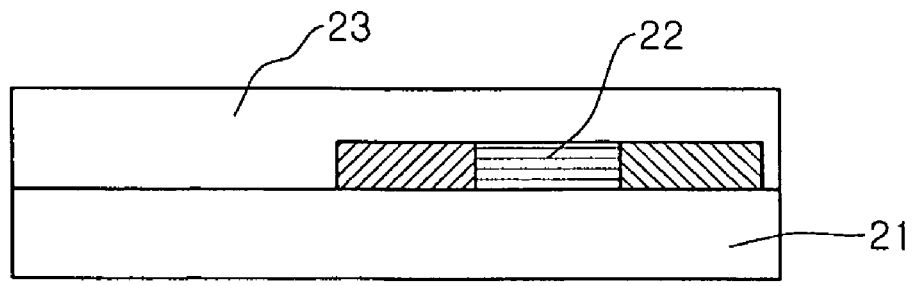
FIGS. 3A to 3F illustrate process steps of a method of manufacturing a CMOS image sensor according to the present invention.

First, as shown in FIG. 3A, a color filter layer 22 is formed on a semiconductor substrate 21 provided with photo-sensing elements (not shown), such as photo-diodes, of an image sensor. A photoresist 23 for forming a planarization layer is then formed on the color filter layer 22. The photoresist 23 has the characteristics of low-sensitivity and high-transmittance in relation to a light source used in an exposure process during photolithography. Preferably, a negative-type photoresist is used. The photoresist 23 for forming the planarization layer preferably has a thickness of about 1.3–3 µm.

Figure 3B:
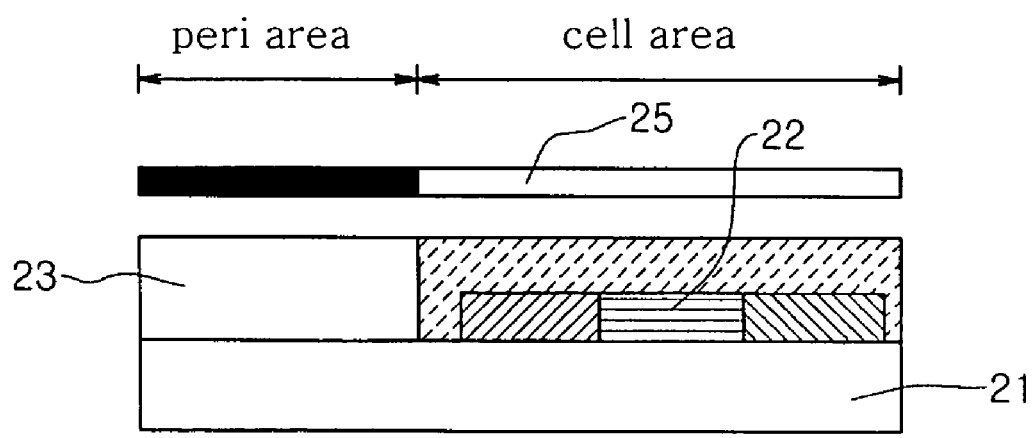

In this state, a planarization layer reticle 25 is used to expose predetermined areas of the photoresist 23 to light, as shown in FIG. 3B. The areas exposed to light correspond to the areas where micro-lenses are to be formed in subsequent process steps. Typically, an area where micro-lenses are to be formed is within a cell area. The areas of planarization layer 23 not exposed to light correspond to the areas where pads (and other optional structures) are to be formed in subsequent process steps. Typically, an area where a pad is to be formed is a peripheral area.

Figure 3C:
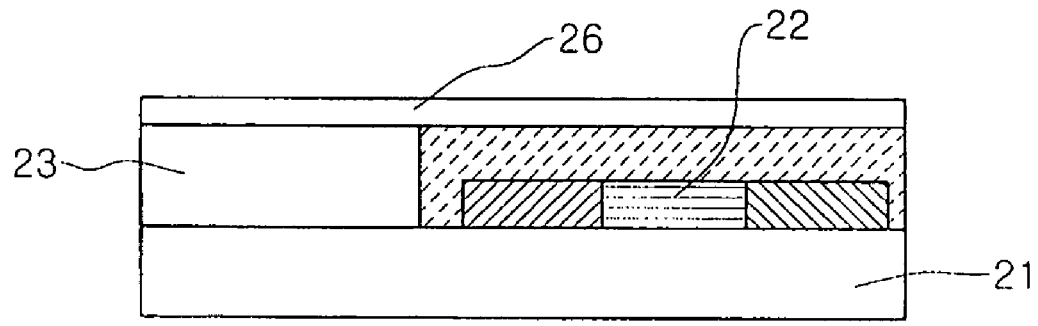

A second photoresist 26 for forming micro-lenses, preferably having a thickness of from about 1.1 to about 1.3 µm, is then coated on the planarization layer photoresist 23, as shown in FIG. 3C. The photoresist 26 for forming micro-lenses is preferably a positive-type photoresist of high sensitivity.

Figure 3D:
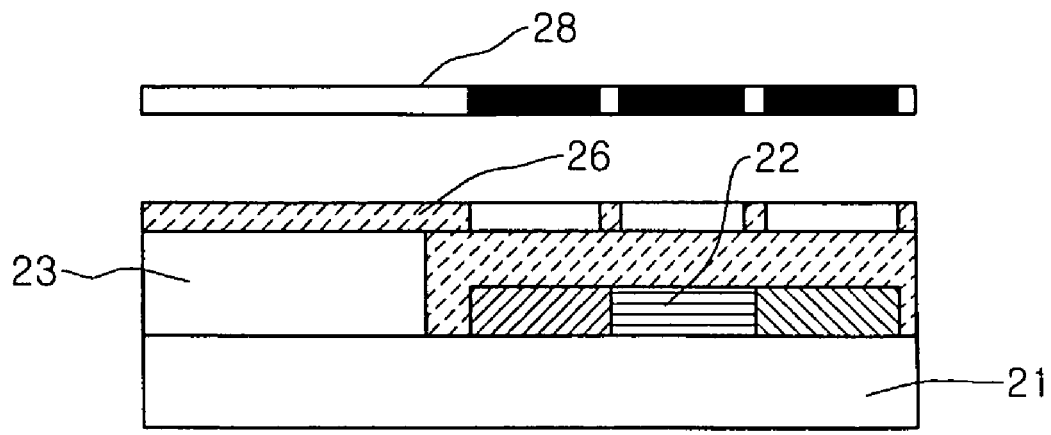

A micro-lens reticle 28 is subsequently used to expose predetermined areas of the photoresist 26 to light selectively, as shown in FIG. 3D. The areas not exposed to light correspond to the areas where micro-lenses are to be formed. The energy used in performing the exposure process must be controlled properly, or the planarization layer photoresist 23 beneath the micro-lens photoresist 26 may be exposed to light. The amount of energy used in the exposure process is preferably 300–500 mJ. Alternatively and/or additionally, the two photoresists 23 and 26 may be selected such that the first photoresist has a relatively low sensitivity (e.g., <10% or even <5%) to the wavelength of light used in the second exposure step, whereas photoresist 26 may have a relatively high sensitivity (e.g., ≧25%, 35%, 40% or 50%) to that wavelength of light.

Figure 3E:
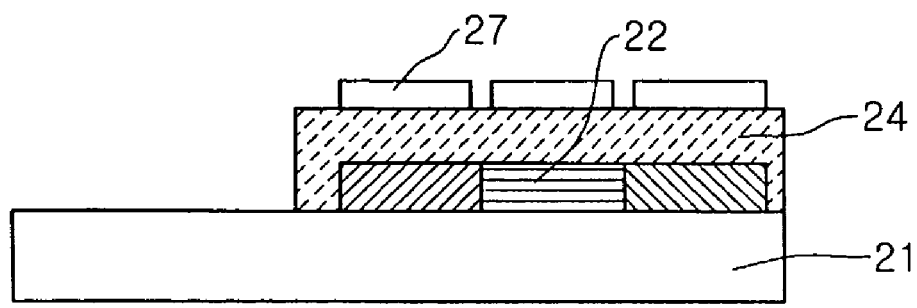

Next, the area of the micro-lens photoresist 26 exposed to light and the area of the planarization layer photoresist 23 not exposed to light are successively developed and removed, as shown in FIG. 3E, thus forming the planarization layer. On the planarization layer, there exist unit micro-lens bodies 27 corresponding to the locations of the micro-lenses. The planarization layer defines outer limits to an area where micro-lenses are to be formed; i.e., a cell area.

Figure 3F:
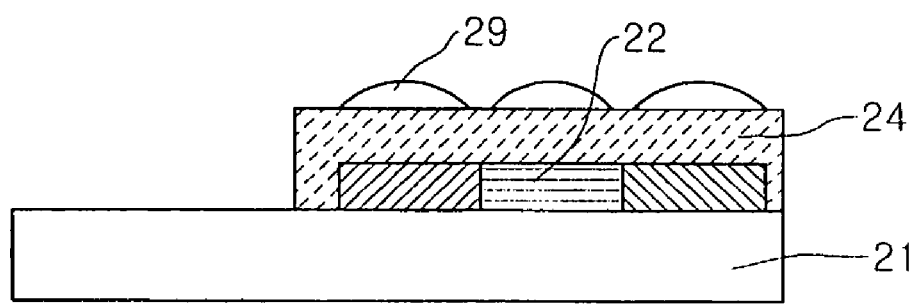

Finally, a baking process is performed at a temperature of about 150° C. to form micro-lenses, as shown in FIG. 3F. During this step, the plurality of micro-lens bodies melt to form micro-lenses 29 of a convex shape. Also, referring back to FIG. 3A, the first photoresist 23 may be selected such that it does not melt or reflow to an appreciable extent during the micro-lens baking step.

The method of manufacturing a CMOS image sensor according to the present invention has advantages as follows: when successively forming a planarization layer and micro-lenses on a color filter layer, the micro-lens photoresist is patterned when the planarization layer photoresist exists in both the peripheral area and the cell area. After patterning the micro-lens layer, the planarization layer photoresist is then patterned to form an overcoat. This avoids any irregular steps or faults at the interface between the peripheral area and the cell area. As a result, micro-lenses of a uniform shape are obtained. The reliability of the CMOS image sensor is also improved.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of manufacturing microlenses in a CMOS image sensor, comprising:
    (a) coating a color filter layer over a semiconductor substrate with a first photoresist;
    (b) selectively exposing the first photoresist to light;
    (c) coating the first photoresist with a second photoresist;
    (d) selectively exposing the second photoresist to light to define a plurality of micro-lens bodies;
    (e) removing areas of the first photoresist to form a planarization layer under the plurality of micro-lens bodies; and
    (f) heating the plurality of micro-lens bodies to form a plurality of micro-lenses.

2. The method according to claim 1, further comprising removing exposed parts of the second photoresist after selectively exposing the second photoresist.

3. The method according to claim 2, comprising removing unexposed parts of the first photoresist after removing exposed parts of the second photoresist.

4. The method according to claim 1, wherein the first photoresist has a thickness of from about 1.3 μm to about 3 μm.

5. The method according to claim 1, wherein the second photoresist has a thickness of from about 1.1 μm to about 1.3 μm.

6. The method according to claim 1, wherein the first photoresist comprises a negative-type photoresist.

7. The method according to claim 6, wherein the second photoresist comprises a positive-type photoresist.

8. The method according to claim 1, wherein the second photoresist comprises a negative-type photoresist.

9. The method according to claim 8, wherein the first photoresist comprises a positive-type photoresist.

10. The method according to claim 1, wherein an amount of energy in the step of selectively exposing the second photoresist is from about 300 mJ to about 500 mJ.

11. The method according to claim 1, wherein an energy used in selectively exposing the second photoresist to light does not expose the first photoresist beneath the second photoresist to light.

12. The method according to claim 1, wherein the first photoresist has a relatively low sensitivity to a wavelength of the light in the step of selectively exposing the second photoresist.

13. The method according to claim 12, wherein the first photoresist has a sensitivity of less than 10% to the wavelength of the light in the step of selectively exposing the second photoresist.

14. The method according to claim 12, wherein the second photoresist has a relatively high sensitivity to a wavelength of The light in the step of selectively exposing the second photoresist.

15. The method according to claim 12, wherein the second photoresist has a sensitivity of more than 25% to the wavelength of the light in the step of selectively exposing the second photoresist.

16. The method according to claim 1, wherein coating the first photoresist with the second photoresist includes coating the area(s) of the first photoresist that are selectively exposed to light with the second photoresist.

17. The method according to claim 1, wherein heating the plurality of micro-lens bodies is performed at a temperature of about 150° C.

18. The method according to claim 7, wherein the first photoresist does not melt or reflow to an appreciable extent during the heating step.

* * * * *